United States Patent
Yu et al.

(10) Patent No.: US 7,382,201 B1
(45) Date of Patent: Jun. 3, 2008

(54) SIGNAL GENERATING APPARATUS AND METHOD THEREOF

(75) Inventors: Tai-Yuan Yu, Taoyuan County (TW); Ping-Ying Wang, Hsinchu (TW); Ling-Wei Ke, Hsin-Chu Hsien (TW); Hsin-Hung Chen, Miaoli County (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/690,145

(22) Filed: Mar. 23, 2007

(51) Int. Cl.
*H03C 3/00* (2006.01)
*H03L 7/06* (2006.01)
*H03L 7/16* (2006.01)

(52) U.S. Cl. .......................... 331/16; 331/14; 331/17; 331/23; 332/127; 455/260

(58) Field of Classification Search ................ 331/1 A, 331/14, 16–18, 23, 25; 332/127; 455/110, 455/260
See application file for complete search history.

(56) References Cited

U.S. PATENT DOCUMENTS

| | | | |
|---|---|---|---|
| 6,724,265 B2 | 4/2004 | Humphreys | |
| 6,806,780 B2 | 10/2004 | Fontaine et al. | |
| 7,068,112 B2 | 6/2006 | Gotz et al. | |
| 7,103,337 B2 | 9/2006 | Uozumi et al. | |
| 7,224,237 B2 * | 5/2007 | Hirano et al. | 332/103 |
| 2004/0041638 A1 * | 3/2004 | Vilcocq et al. | 331/16 |
| 2005/0156676 A1 * | 7/2005 | Wang et al. | 331/16 |

* cited by examiner

*Primary Examiner*—David Mis
(74) *Attorney, Agent, or Firm*—Winston Hsu

(57) ABSTRACT

A signal generating apparatus is disclosed for generating a synthesized signal according to an input signal, the signal generating apparatus includes a phase-locked loop device for generating the synthesized signal; a control unit for controlling the control signal generator to adjust the control signal in a calibration mode to thereby adjust a frequency of the synthesized signal, wherein the phase/frequency detector does not output the detected signal to the control signal generator in the calibration mode; a detecting device for detecting the synthesized signal to generate a calibrating signal in the calibration mode; a filtering device for filtering the input signal and calibrating the input signal according to the calibrating signal to generate a filtered signal; and a modulating device for modulating the filtered signal to generate the dividing factor.

12 Claims, 5 Drawing Sheets

SIGNAL GENERATING APPARATUS AND METHOD THEREOF

BACKGROUND

The present invention relates to a signal generating apparatus, and more particularly to a phase-locked loop based transmitter with an open loop modulation compensation scheme, wherein the modulation compensation scheme calibrates a compensation filter according to an output frequency of a controllable oscillator of the signal generating apparatus, and a method thereof.

Please refer to FIG. 1. FIG. 1 is a related art Sigma-delta fractional N phase locked loop (PLL) transmitter 10. The Sigma-delta fractional N PLL transmitter 10 comprises a phase locked loop circuit 11, a Sigma-delta modulator 12, a channel selector 13, a Gaussian filter 14, and a compensation filter 15. The phase locked loop circuit 11 comprises a phase/frequency detector 11a, a charge pump circuit 11b, a loop filter 11c, a voltage-controlled oscillator 11d, and a divider 11e. The baseband data Sb is inputted to the Gaussian filter 14 to extract the required band of the Sigma-delta fractional N PLL transmitter 10. For example, if the transmitted signal of the Sigma-delta fractional N PLL transmitter 10 is the GMSK signal $S_{GMSK}$, then the Gaussian filter 14 is the GMSK filter. Furthermore, as the frequency response of the phase locked loop circuit 11 acts like a low pass filter, the compensation filter is utilized to compensate the baseband data Sb before being modulated by the Sigma-delta modulator 12. Furthermore, the phase locked loop circuit 11 utilizes a reference frequency Sr to synthesize the required frequency to transmit the baseband data Sb. In a multi-band system, the phase locked loop circuit 11 needs to generate different frequency bands, and the channel selector 13 is utilized to select the required frequency band. Accordingly, by adjusting the dividing number of the divider 11e, the phase locked loop circuit 11 can generate different frequency bands accordingly.

However, it is well-known that the loop bandwidth of the phase locked loop circuit 11 is sensitive to the transfer function of the phase locked loop circuit 11. To deal with this problem, some conventional techniques have been disclosed, such as U.S. Pat. Nos. 7,103,337, 7,068,112, 6,724,265, and No. 6,806,780.

SUMMARY

One of the objectives of the present invention is to provide a phase-locked loop based transmitter with an open loop modulation compensation scheme, wherein the modulation compensation scheme calibrates a compensation filter according to an output frequency of a controllable oscillator of the signal generating apparatus and method thereof.

According to an embodiment of the present invention, a signal generating apparatus is disclosed. The signal generating apparatus generating a synthesized signal according to an input signal, comprising a phase-locked loop device, a control unit, a detecting device, a filtering device, and a modulating device. The phase-locked loop device comprises: a phase/frequency detector for generating a detected signal according to a reference oscillating signal and a feedback signal; a control signal generator coupled to the phase/frequency detector for generating a control signal according to the detected signal; a voltage controlled oscillator coupled to the control signal generator for generating the synthesized signal according to the control signal; and a divider coupled to the voltage controlled oscillator for dividing the synthesized signal according to a dividing factor for generating the feedback signal. The control unit is coupled to the control signal generator for controlling the control signal generator to adjust the control signal in a calibration mode to thereby adjust a frequency of the synthesized signal, wherein the phase/frequency detector does not output the detected signal to the control signal generator in the calibration mode. The detecting device is coupled to the voltage controlled oscillator for detecting the synthesized signal to generate a calibrating signal in the calibration mode. The filtering device is coupled to the detecting device for filtering the input signal and be calibrated by the calibrating signal generated by the detecting device. The modulating device is coupled to the filtering device and the divider for modulating the filtered signal to generate the dividing factor.

According to another embodiment of the present invention, a signal generating method is disclosed. The signal generating method generates a synthesized signal according to an input signal, the signal generating method comprises the steps of: utilizing a phase-locked loop device to generate the synthesized signal, wherein the phase-locked loop device comprises a phase/frequency detector for generating a detected signal according to a reference oscillating signal and a feedback signal; a control signal generator coupled to the phase/frequency detector for generating a control signal according to the detected signal; a voltage controlled oscillator coupled to the control signal generator for generating the synthesized signal according to the control signal; and a divider coupled to the voltage controlled oscillator for dividing the synthesized signal according to a dividing factor for generating the feedback signal; controlling the control signal generator to adjust the control signal in a calibration mode to thereby adjust a frequency of the synthesized signal, wherein the phase/frequency detector does not output the detected signal to the control signal generator in the calibration mode; detecting the synthesized signal to generate a calibrating signal in the calibration mode; calibrating the filtering device according to the calibrating signal and filtering the input signal to generate a filtered signal; and modulating the filtered signal to generate the dividing factor. These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
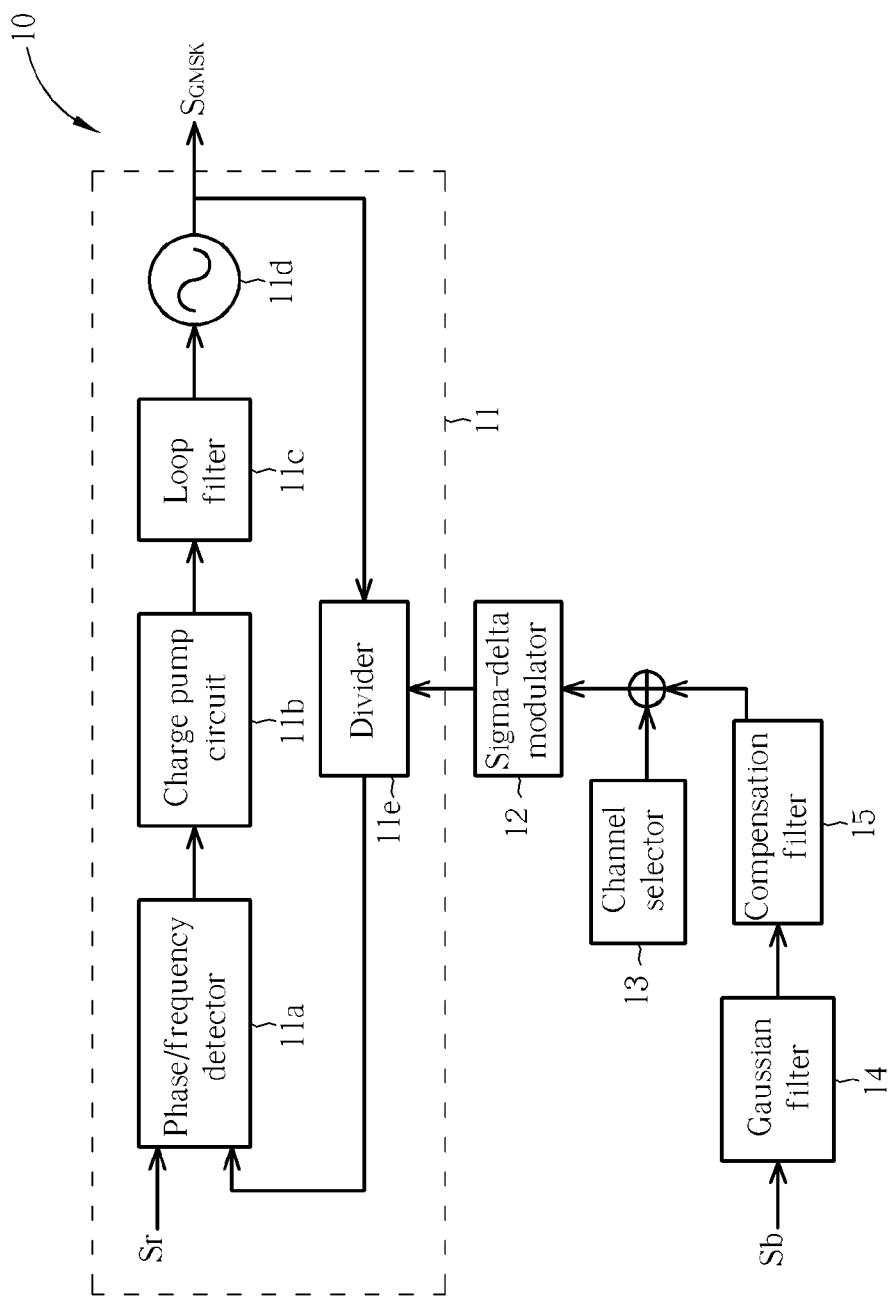
FIG. 1 is a related art Sigma-delta fractional N phase locked loop (PLL) transmitter.
Figure 2:
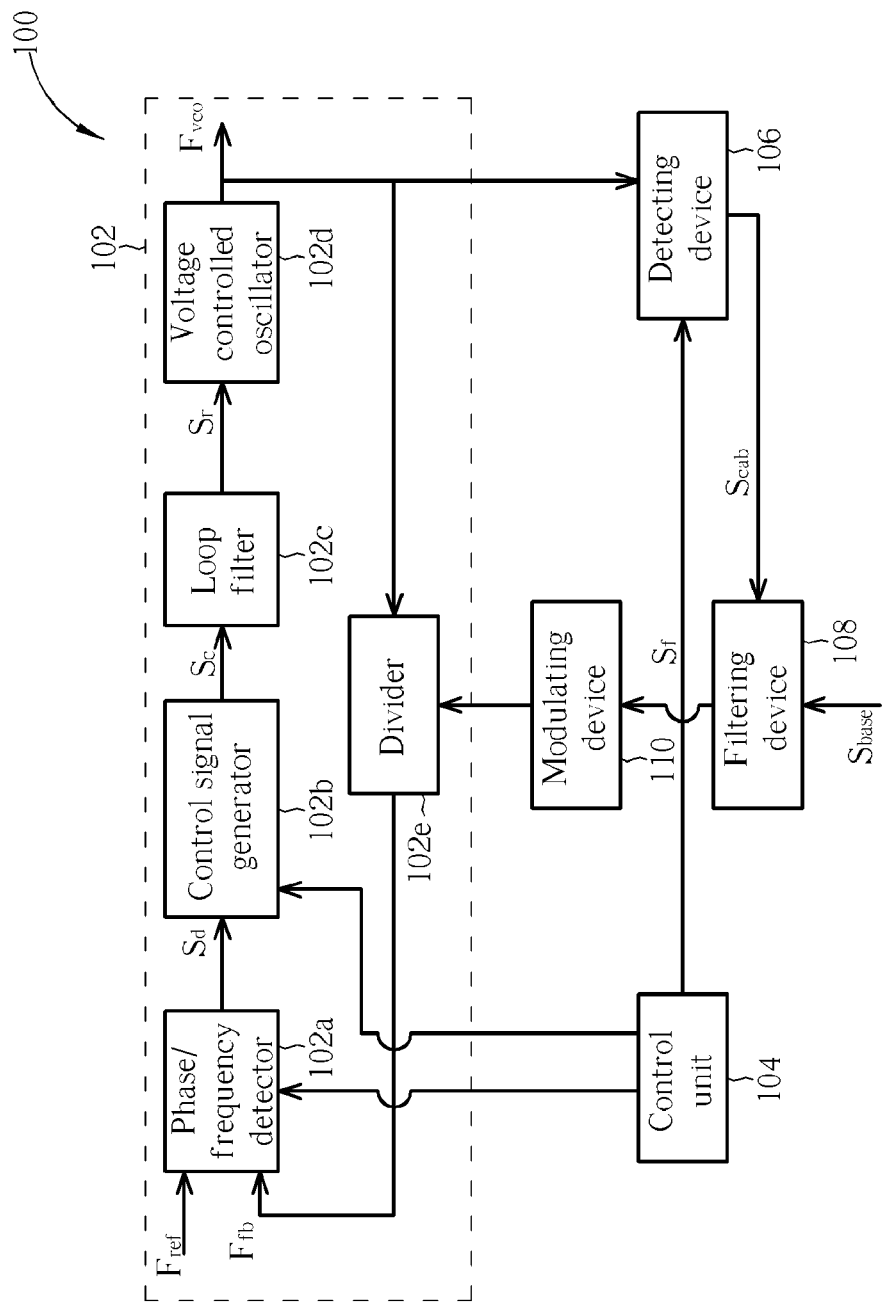
FIG. 2 is a diagram illustrating a signal generating apparatus according to an embodiment of the present invention.

Please refer to FIG. 2. FIG. 2 is a diagram illustrating a signal generating apparatus 100 according to an embodiment of the present invention. The signal generating apparatus 100 generates a synthesized signal $F_{vco}$ according to an input signal $S_{base}$, and the signal generating apparatus 100 comprises a phase-locked loop device 102, a control unit 104, a detecting device 106, a filtering device 108, and a modulating device 110. Please note that those skilled in this art will readily understand that the signal generating apparatus 100 can be implemented as a fractional N PLL (Phase-locked loop) synthesizer with an adaptive compensation filter, i.e., the filtering device 108. The phase-locked loop device 102 comprises a phase/frequency detector 102a, a control signal generator 102b, a loop filter 102c, a voltage controlled oscillator 102d, and a divider 102e. The phase/frequency detector 102a is coupled to a reference oscillating signal $F_{ref}$ for generating a detected signal $S_d$ according to the reference oscillating signal $F_{ref}$ and a feedback signal $F_{fb}$. The control signal generator 102b is coupled to the phase detector 102a for generating a control signal $S_c$ according to the detected signal $S_d$. The loop filter 102c is coupled to the control signal generator 102b for filtering the control signal $S_c$ to generate a reference signal $S_r$. The voltage controlled oscillator 102d is coupled to the loop filter 102c for generating the synthesized signal $F_{vco}$ according to the control signal $S_c$. The divider 102e coupled to the voltage controlled oscillator 102d, the modulating device 110, and the phase/frequency detector 102a for dividing the synthesized signal $F_{vco}$ according to a dividing factor N and outputting the feedback signal $F_{fb}$ to phase/frequency detector 102a. The control unit 104 is coupled to the phase/frequency detector 102a, the control signal generator 102b, and the detecting device 106 for controlling the control signal generator 102b to adjust the control signal $S_c$ in a calibration mode to thereby adjust a frequency of the synthesized signal $F_{vco}$, wherein the phase/frequency detector 102a is disabled by the control unit 104 in the calibration mode. In other words, the phase detector 102a does not output the detected signal $S_d$ to the control signal generator 102b in the calibration mode. The detecting device 106 is coupled to the voltage controlled oscillator 102d for detecting the synthesized signal $F_{vco}$ to generate a calibrating signal $S_{cab}$ in the calibration mode. The filtering device 108 is coupled to the detecting device 106 and calibrated by the calibrating signal. After being calibrated, the filtering device will filter the input data $S_{base}$ to generate a filtered signal $S_f$. The modulating device 110 is coupled to the filtering device 108 and the divider 102e for modulating the filtered signal $S_f$ to generate the dividing factor N.

Figure 3:
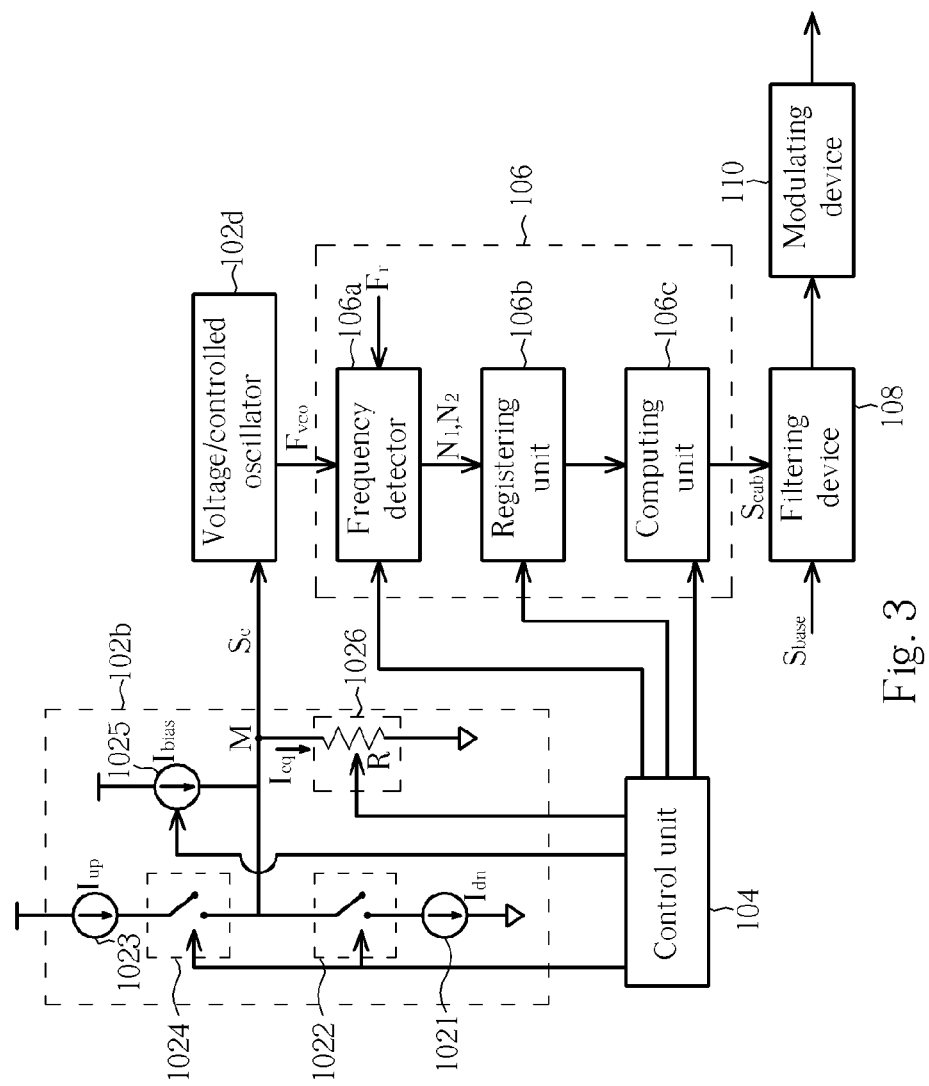
FIG. 3 is a diagram illustrating the detecting device and the control signal generator according to a first embodiment of the present invention.

Please refer to FIG. 3. FIG. 3 is a diagram illustrating the detecting device 106 and the control signal generator 102b according to a first embodiment of the present invention. The detecting device 106 comprises a frequency detector 106a, a registering unit 106b, and a computing unit 106c. The frequency detector 106a is coupled to the voltage controlled oscillator 102d and the control unit 104 for detecting a first synthesized signal $F_{vco1}$ and a second synthesized signal $F_{vco2}$ to generate a first counting value $N_1$ and a second counting value $N_2$ respectively. The registering unit 106b is coupled to the frequency detector 106a and the control unit 104 for registering the first counting value $N_1$ and the second counting value $N_2$. The computing unit 106c is coupled to the registering unit 106b and the control unit 104 for generating the calibrating signal $S_{cab}$ according to a predetermined difference value $\Delta N_c$ and a difference value $\Delta N_{c1}$ between the first counting value $N_1$ and the second counting value $N_2$.

Furthermore, the control signal generator 102b comprises a discharging current source 1021, a first switch 1022, a charging current source 1023, a second switch 1024, a bias current source 1025, and an impedance unit 1026. The discharging current source 1021 generates a discharging current $I_{dn}$. The first switch 1022 is coupled to the discharging current $I_{dn}$ for selectively coupling the discharging current source 1021 to an output node M of the control signal generator 102b, wherein the first switch 1022 is controlled by the detected signal $S_d$ in a normal mode and controlled by the control unit 104 in the calibration mode. Please note that, in order to describe the spirit of the present invention more clearly, the loop filter 102c is not shown in FIG. 3. However, those skilled in this art will readily know that the loop filter 102c can be placed between the control signal generator 102b and the voltage controlled oscillator 102d. The charging current source 1023 generates a charging current $I_{up}$. The second switch 1024 is coupled to the charging current $I_{up}$ for selectively coupling the charging current source 1023 to the output node M of the control signal generator 102b, wherein the second switch 1024 is controlled by the detected signal $S_d$ in the normal mode and controlled by the control unit 104 in the calibration mode. The bias current source 1025 is coupled to the output node M of the control signal generator 102b for generating a bias current $I_{bias}$. The impedance unit 1026 is coupled to the output node M of the control signal generator 102b for setting the control signal $S_c$ according to an equivalent current $I_{eq}$ flowing through the impedance unit 1026, wherein when the first switch 1022 is turned on and the second switch 1024 is turned off by the control unit 104, a first control signal $S_{c1}$ is outputted to the voltage controlled oscillator 102d to make the voltage controlled oscillator 102d generate the first synthesized signal $F_{vco1}$, and when the first switch 1022 is turned off and the second switch 1024 is turned on by the control unit 104, a second control signal $S_{c2}$ is outputted to the voltage controlled oscillator 102d to make the voltage controlled oscillator 102d generate the second synthesized signal $F_{vco2}$.

As known by those skilled in this art, the open-loop transfer function $T_{op}(s)$ of the phase-locked loop device 102 can be shown as the following equation (1):

$$T_{op}(s) = \left(\frac{K_{pfd} * K_{vco}}{N}\right) * \left(\frac{(s*\tau_{z1}+1)*(s*\tau_{z2}+1) \ldots (s*\tau_{zl}+1)}{s^m*(s*\tau_{p1}+1)*(s*\tau_{p2}+1) \ldots (s*\tau_{pl}+1)}\right) \quad (1)$$

$$= K_G * L(s)$$

Wherein, $K_{pfd}$ is the transfer function from the phase detector 102a to the control signal generator 102b, $K_{vco}$ is the sensitivity of the voltage controlled oscillator 102d, and N is the dividing factor of the divider 102e. Therefore, the closed-loop transfer function $T(s)$ of the phase-locked loop device 102 can then be the following equation (2):

$$T(s) = K_G * L(s)/(1+K_G * L(s)). \quad (2)$$

After the signal generating apparatus 100 is fabricated, and as is well known by those skilled in this art, the compensation transfer function $Comp(s)$ of the filtering device 108 can be shown as the following equation (3):

$$Comp(s) = 1/T'(s) \qquad (3)$$
$$= (1/T(s)) * G_{cal}$$
$$= 1 + 1/(K_G * L(s)) * G_{cal}$$
$$= 1 + (N/K_{pfd} * K_{vco})/L(s) * G_{cal},$$

wherein "'" means the real value after fabrication, and $G_{cal}$ is the calibrating factor of the filtering device 108. Accordingly, in order to let the filtering device 108 have the transfer function that fits to the real response of the phase-locked loop device 102, the calibrating factor $G_{cal}$ can be set as the following equation:

$$G_{cal} = (N'/K'_{pfd} * K'_{vco})/(N/K_{pfd} * K_{vco}). \qquad (4)$$

Thus, the compensation transfer function Comp(s) of the filtering device 108 becomes:

$$Comp(s) = (1/T'_{op}(s))$$

wherein $T'_{op}(s)$ is the open-loop transfer function of the phase-locked loop device 102, $K'_{pfd}$ is the transfer function from the phase detector 102a to the control signal generator 102b, $K'_{vco}$ is the sensitivity of the voltage controlled oscillator 102d, and N' is the dividing factor of the divider 102e after fabrication.

Then, the following paragraph is focused on the operation to obtain the calibrating factor $G_{cal}$ of the signal generating apparatus 100. Please refer to FIG. 3 again. In the ideal case, which is the case that before the signal generating apparatus 100 is fabricated, the control unit 104 controls the first switch 1022 to couple the discharging current $I_{dn}$ to the output node M of the control signal generator 102b and opens the second switch 1024, then the first control signal $S_{c1}$ is outputted to the voltage controlled oscillator 102d to make the voltage controlled oscillator 102d generate the first synthesized signal $F_{vco1}$, i.e., $$F_{vco1} = F_{free} + (I_{bias} - I_{dn}) * R * K_{vco} = F_r * N_1, \qquad (5)$$

wherein $F_{free}$ is the frequency only generated by the bias current $I_{bias}$, $F_r$ is the reference frequency inputted to the frequency detector 106a, and R is the resistance of the impedance unit 1026. Accordingly, the frequency detector 106a generates the first counting value $N_1$ corresponding to the first synthesized signal $F_{vco1}$. Then, the control unit 104 controls the second switch 1024 to couple the charging current $I_{up}$ to the output node M of the control signal generator 102b and opens the first switch 1022, then the second control signal $S_{c2}$ is outputted to the voltage controlled oscillator 102d to make the voltage controlled oscillator 102d generate the second synthesized signal $F_{vco2}$, i.e., $$F_{vco2} = F_{free} + (I_{bias} + I_{up}) * R * K_{vco} = F_r * N_2. \qquad (6)$$

Accordingly, the frequency detector 106a generates the second counting value $N_2$ corresponding to the second synthesized signal $F_{vco2}$. Therefore, the difference frequency between the first synthesized signal $F_{vco1}$ and the second synthesized signal $F_{vco2}$ is:

$$F_{vco2} - F_{vco1} = F_r * (N_2 - N_1)$$
$$= (I_{up} + I_{dn}) * R * K_{vco}$$
$$= 2 * I_{chp} * R * K_{vco}$$
$$= A,$$

wherein, for brevity, setting $I_{up} = I_{dn} = I_{chp}$.

Similarly, in the real case, which is the case that after the signal generating apparatus 100 is fabricated, the control unit 104 controls the first switch 1022 to couple the discharging current $I_{dn}'$ to the output node M of the control signal generator 102b and opens the second switch 1024, then the first control signal $S_{c1}'$ is outputted to the voltage controlled oscillator 102d to make the voltage controlled oscillator 102d to generate the first synthesized signal $F_{vco1}'$, i.e., $$F_{vco1}' = F_{free}' + (I_{bias}' - I_{dn}') * R' * K_{vco}' = F_r' * N_1', \qquad (7)$$

wherein "'" means the real value after fabrication. Accordingly, the frequency detector 106a generates the first counting value $N_1'$ corresponding to the first synthesized signal $F_{vco1}'$. Then, the control unit 104 controls the second switch 1024 to couple the charging current $I_{up}'$ to the output node M of the control signal generator 102b and opens the first switch 1022, and the second control signal $S_{c2}'$ is outputted to the controllable oscillator 102d to make the voltage controlled oscillator 102d generate the second synthesized signal $F_{vco2}'$, i.e., $$F_{vco2}' = F_{free}' + (I_{bias}' + I_{up}') * R' * K_{vco}' = F_r' * N_2'. \qquad (8)$$

Accordingly, the frequency detector 106a generates the second counting value $N_2'$ corresponding to the second synthesized signal $F_{vco2}'$. Therefore, the difference frequency between the first synthesized signal $F_{vco1}'$ and the second synthesized signal $F_{vco2}'$ is:

$$F_{vco2}' - F_{vco1}' = F_r' * (N_2' - N_1')$$
$$= (I_{up}' + I_{dn}') * R' * K_{vco}'$$
$$= 2 * I_{chp}' * R' * K_{vco}'$$
$$= B,$$

similarly, for brevity, setting $I_{up}' = I_{dn}' = I_{chp}'$.

Furthermore, $$A/B = (N_2 - N_1)/(N_2' - N_1')$$
$$= \Delta N_c / \Delta N_{c1}$$
$$= (I_{chp} * R * K_{vco})/(I_{chp}' * R' * K_{vco}'),$$

then, according to the equation (4), $$G_{cal} = (K_{pfd} * K_{vco} * N')/(K_{pfd}' * K_{vco}' * N)$$
$$= (I_{chp} * K_{vco} * N')/(I_{chp}' * K_{vco}' * N), \text{ if } R = R', \text{ then}$$
$$G_{cal} = (\Delta N_c / \Delta N_{c1}) * (N'/N).$$

Please note that, as the dividing factors N, N' of the divider 102e are the known factors in the calibration mode and $\Delta N_c$ is predetermined, the computing unit 106c only computes the difference value $\Delta N_{c1}$ and sets the calibrating signal $S_{cab}$ to be the calibrating factor $G_{cal}$.

Figure 4:
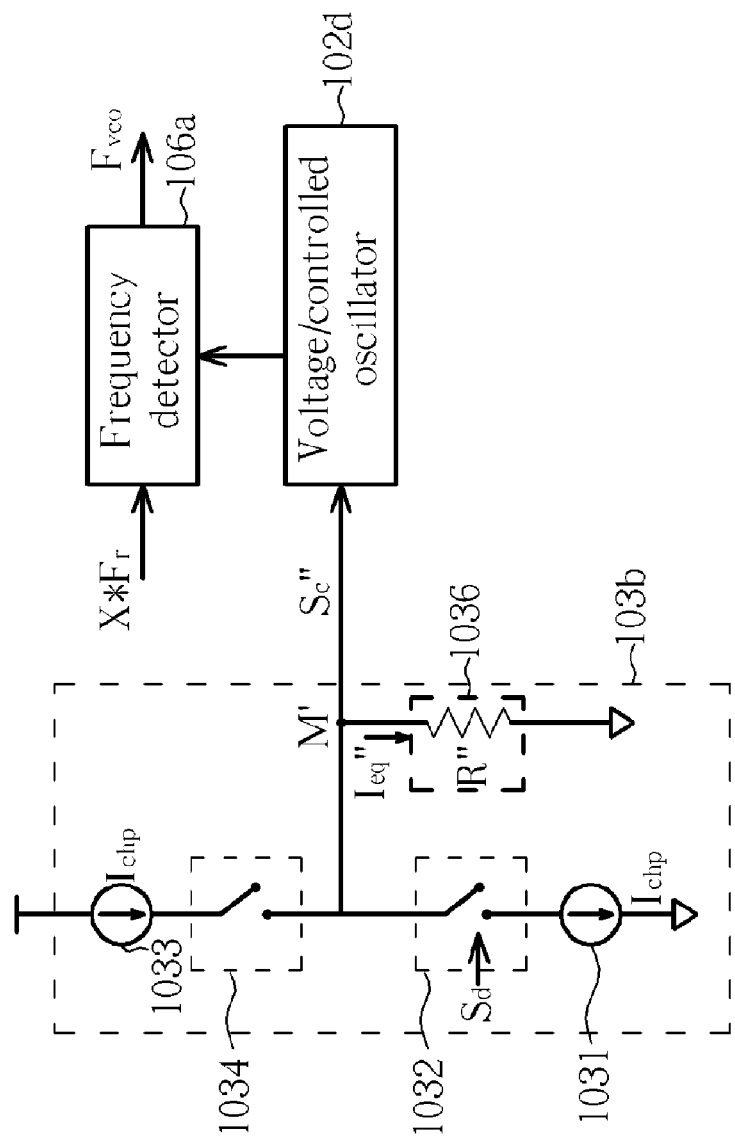
FIG. 4 is a diagram illustrating a control signal generator according to a second embodiment of the present invention.

Please refer to FIG. 4. FIG. 4 is a diagram illustrating a control signal generator 103b according to a second embodiment of the present invention. The control signal generator 103b comprises a discharging current source 1031, a first switch 1032, a charging current source 1033, a second switch 1034 and an adjustable impedance unit 1036. The discharging current source 1031 generates a discharging current $I_{chp}$. The first switch 1032 is coupled to the discharging current $I_{chp}$ for selectively coupling the discharging current source 1031 to an output node M' of the control signal generator 103b, wherein the first switch 1032 is controlled by the detected signal $S_d$ in a normal mode and controlled by the control unit 104 in the calibration mode. The adjustable impedance unit 1036 is coupled to the output node M' of the control signal generator 103b for setting the control signal $S_c''$ according to an equivalent current $I_{eq}''$ flowing through the adjustable impedance unit 1036, wherein when either the first switch 1032 and the second switch 1034 is turned on by the control unit 104, the control unit 104 sets the adjustable impedance unit 1036 to a first impedance value $R_1''$ to thereby make the voltage controlled oscillator 102d generate the first synthesized signal $F_{vco1}$, and the control unit 104 further sets the adjustable impedance unit 1036 to a second impedance value $R_2''$ to thereby make the voltage controlled oscillator 102d generate the second synthesized signal $F_{vco2}$. Please note that, in order to describe the spirit of the present invention more clearly, the voltage controlled oscillator 102d and the frequency detector 106a are also shown in FIG. 4. Furthermore, in this embodiment, the reference frequency inputted to the frequency detector 106a is $X*F_r$, wherein X is an integer number.

Similar to the above-mentioned embodiment control signal generator 102b, in the ideal case, before the signal generating apparatus 100 is fabricated, the control unit 104 controls the second switch 1034 to couple the charging current $I_{chp}$ to the output node M" of the control signal generator 103b and opens the first switch 1032, then the control unit 104 adjusts a percentage P of the adjustable impedance unit 1036 to generate the first impedance value $R_1''$ and the second impedance value $R_2''$. Accordingly, the controllable oscillator 102d generates a first difference frequency $\Delta F$, i.e., $$\Delta F = (F_r * X) * \Delta N_c$$
$$= (I_{chp} * R'' * P * K_{vco})$$
$$= A,$$

wherein $R''*P = R_2'' - R_1''$.

Similarly, in the real case, which is the case that after the signal generating apparatus 100 is fabricated, the control unit 104 controls the second switch 1034 to couple the charging current $I_{chp}'$ to the output node M" of the control signal generator 103b and opens the first switch 1032, then the control unit 104 adjusts a percentage P' of the adjustable impedance unit 1036 to generate the first impedance value $R_1'''$ and the second impedance value $R_2'''$. Accordingly, the voltage controlled oscillator 102d generates a first difference frequency $\Delta F'$, i.e., $$\Delta F' = (F_r * X) * \Delta N_c'$$
$$= (I_{chp}' * R''' * P' * K_{vco}')$$
$$= B,$$

wherein $R'''*P' = R_2''' - R_1'''$, and "'''" means the real value after fabrication.

Furthermore, $$A/B = (I_{chp} * R'' * P * K_{vco})/(I_{chp}' * R''' * P' * K_{vco}'),$$
$$= (I_{chp} * K_{vco})/(I_{chp}' * K_{vco}'), \text{ if } R''*P \text{ is calibrated to equal } R'''*P',$$
$$= \Delta N_c / \Delta N_c'.$$

Accordingly, the calibrating factor $G_{cal}$ can be obtained, i.e., $$G_{cal} = (\Delta N_c / \Delta N_c') * (N'/N).$$

Please note that, in other embodiments of the present invention, the control signal generator 102b can be implemented by replacing the bias current source 1025 with an adjustable bias current source, which is controlled by the control unit 104. Those skilled in this art can easily understand the operation of this embodiment after reading the disclosure of the present invention, thus the detailed description is omitted here for brevity.

Furthermore, in another embodiment of the present invention, the control signal generator 102b can be implemented by replacing the impedance unit 1026 with an adjustable impedance unit, which is controlled by the control unit 104. Those skilled in this art can easily understand the operation of this embodiment after reading the disclosure of the present invention, thus the detailed description is omitted here for brevity.

Figure 5:
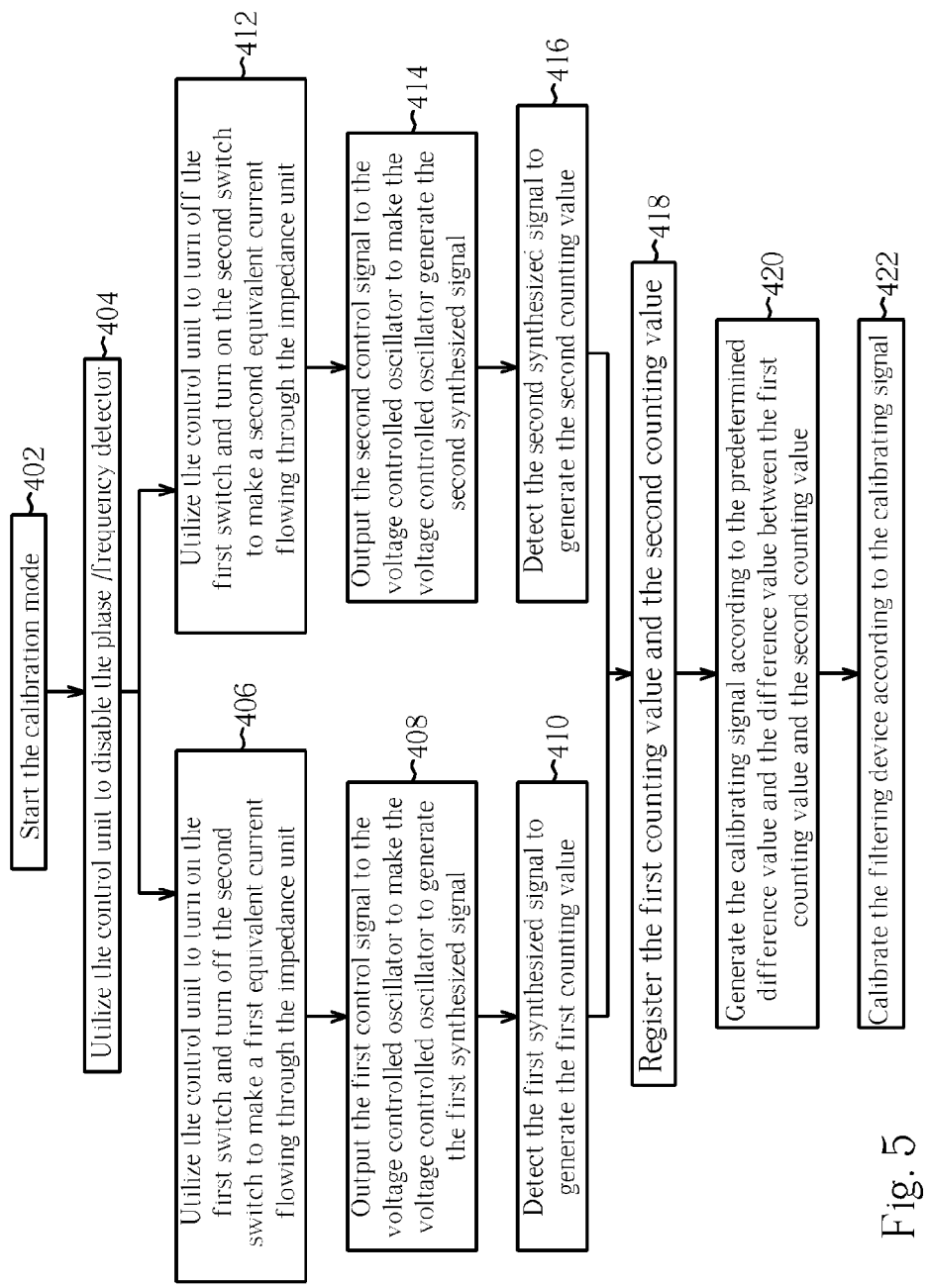
FIG. 5 is a flowchart illustrating a signal generating method employed by the signal generating apparatus as shown in FIG. 2.

Please refer to FIG. 5. FIG. 5 is a flowchart illustrating a signal generating method employed by the signal generating apparatus 100 as shown in FIG. 2. In other words, the signal generating method is described through the fractional N PLL (Phase-locked loop) synthesizer with the adaptive compensation filter, i.e., the filtering device 108. The signal generating method comprises the following steps:

| | |
|---|---|
| Step 402: | Start the calibration mode; |
| Step 404: | Utilize the control unit 104 to disable the phase/frequency detector 102a; |
| Step 406: | Utilize the control unit 104 to turn on the first switch 1022 and turn off the second switch 1024 to make a first equivalent current $I_{eq1}$ flow through the impedance unit 1026; |
| Step 408: | Output the first control signal $S_{c1}$ to the voltage controlled oscillator 102d to make the voltage controlled oscillator 102d to generate the first synthesized signal $F_{vco1}$; |
| Step 410: | Detect the first synthesized signal $F_{vco1}$ to generate the first counting value $N_1$, go to step 418; |
| Step 412: | Utilize the control unit 104 to turn off the first switch 1022 and turn on the second switch 1024 to make a second equivalent current $I_{eq2}$ flow through the impedance unit 1026; |
| Step 414: | Output the second control signal $S_{c2}$ to the voltage controlled oscillator 102d to make the voltage controlled oscillator 102d generate the second synthesized signal $F_{vco2}$; |
| Step 416: | Detect the second synthesized signal $F_{vco2}$ to generate the second counting value $N_2$; |
| Step 418: | Register the first counting value $N_1$ and the second counting value $N_2$; |
| Step 420: | Generate the calibrating signal $S_{cal}$, according to the predetermined difference value $\Delta N_c$ and the difference value $\Delta N_{c1}$ between the first counting value $N_1$ and the second counting value $N_2$; |
| Step 422: | Calibrate the filtering device 108 according to the calibrating signal $S_{cal}$. |

In step 404, when the control unit 104 disables the phase/frequency detector 102a, the control signal generator 102b is not affected by the detected signal $S_d$ of the phase/frequency detector 102a. In other words, the signal generating apparatus 100 is an open loop under the calibration mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal generating apparatus, for generating a synthesized signal according to an input signal, comprising:
    a phase-locked loop device, comprising:
        a phase/frequency detector, for generating a detected signal according to a reference oscillating signal and a feedback signal;
        a control signal generator, coupled to the phase/frequency detector, for generating a control signal according to the detected signal;
        a voltage controlled oscillator, coupled to the control signal generator, for generating the synthesized signal according to the control signal; and
        a divider, coupled to the voltage controlled oscillator, for dividing the synthesized signal according to a dividing factor for generating the feedback signal;
    a control unit, coupled to the control signal generator, for controlling the control signal generator to adjust the control signal in a calibration mode to thereby adjust a frequency of the synthesized signal, wherein the phase/frequency detector does not output the detected signal to the control signal generator in the calibration mode;
    a detecting device, coupled to the voltage controlled oscillator, for detecting the synthesized signal to generate a calibrating signal in the calibration mode;
    a filtering device, coupled to the detecting device, for filtering the input signal and calibrating the input signal according to the calibrating signal to generate a filtered signal; and
    a modulating device, coupled to the filtering device and the divider, for modulating the filtered signal to generate the dividing factor.

2. The signal generating apparatus of claim 1, wherein the detecting device comprises:
    a frequency detector, coupled to the voltage controlled oscillator, for detecting a first synthesized signal and a second synthesized signal to generate a first counting value and a second counting value respectively;
    a registering unit, coupled to the frequency detector, for registering the first counting value and the second counting value; and
    a computing unit, coupled to the registering unit, for generating the calibrating signal according to a predetermined difference value and a difference value between the first counting value and the second counting value.

3. The signal generating apparatus of claim 2, wherein the control signal generator comprises:
    a charging current source, for generating a charging current;
    a first switch, coupled to the charging current, for selectively coupling the charging current source to an output node of the control signal generator, wherein the first switch is controlled by the detected signal in a normal mode and controlled by the control unit in the calibration mode;
    a discharging current source, for generating a discharging current;
    a second switch, coupled to the discharging current, for selectively coupling the discharging current source to the output node of the control signal generator, wherein the second switch is controlled by the detected signal in the normal mode and controlled by the control unit in the calibration mode;
    a bias current source, coupled to the output node of the control signal generator, for generating a bias current; and
    an impedance unit, coupled to the output node of the control signal generator, for setting the control signal according to an equivalent current flowing through the impedance unit, wherein when the first switch is turned on and the second switch is turned off by the control unit, a first control signal is outputted to the controllable oscillator to make the controllable oscillator generate the first synthesized signal, and when the first switch is turned off and the second switch is turned on by the control unit, a second control signal is outputted to the controllable oscillator to make the controllable oscillator generate the second synthesized signal.

4. The signal generating apparatus of claim 2, wherein the control signal generator comprises:
    a charging current source, for generating a charging current;
    a first switch, coupled to the charging current, for selectively coupling the charging current source to an output node of the control signal generator, wherein the first switch is controlled by the detected signal in a normal mode and controlled by the control unit in the calibration mode;
    a discharging current source, for generating a discharging current;
    a second switch, coupled to the discharging current, for selectively coupling the discharging current source to the output node of the control signal generator, wherein the second switch is controlled by the detected signal in the normal mode and controlled by the control unit in the calibration mode;
    an adjustable impedance unit, coupled to the output node of the control signal generator and the control unit, for setting the control signal according to the current flowing through the impedance unit, wherein when one of the first switch and the second switch is turned on by the control unit, the control unit sets the adjustable impedance unit to a first impedance value to thereby make the controllable oscillator generate the first synthesized signal, and the control unit further sets the adjustable impedance unit to a second impedance value to thereby make the voltage controlled oscillator generate the second synthesized signal.

5. The signal generating apparatus of claim 2, wherein the control signal generator comprises:
    a charging current source, for generating a charging current;
    a first switch, coupled to the charging current, for selectively coupling the charging current source to an output node of the control signal generator, wherein the first switch is controlled by the detected signal in a normal mode and turned off by the control unit in the calibration mode;
    a discharging current source, for generating a discharging current;
    a second switch, coupled to the discharging current, for selectively coupling the discharging current source to the output node of the control signal generator, wherein the second switch is controlled by the detected signal in the normal mode and turned off by the control unit in the calibration mode;

an adjustable bias current source, coupled to the output node of the control signal generator and the control unit, for generating a bias current; and an impedance unit, coupled to the output node of the control signal generator, for setting the control signal according to an equivalent current flowing through the impedance unit, wherein in the calibration mode, the control unit sets the adjustable bias current source to provide a first bias current to thereby make the voltage controlled oscillator generate the first synthesized signal, and the control unit further sets the adjustable bias current source to provide a second bias current to thereby make the voltage controlled oscillator generate the second synthesized signal.

6. The signal generating apparatus of claim 2, wherein the control signal generator comprises:

a charging current source, for generating a charging current;

a first switch, coupled to the charging current, for selectively coupling the charging current source to an output node of the control signal generator, wherein the first switch is controlled by the detected signal in a normal mode and turned off by the control unit in the calibration mode;

a discharging current source, for generating a discharging current;

a second switch, coupled to the discharging current, for selectively coupling the discharging current source to the output node of the control signal generator, wherein the second switch is controlled by the detected signal in the normal mode and turned off by the control unit in the calibration mode;

a bias current source, coupled to the output node of the control signal generator, for generating a bias current; and an adjustable impedance unit, coupled to the output node of the control signal generator and the control unit, for setting the control signal according to an equivalent current flowing through the impedance unit, wherein in the calibration mode, the control unit sets the adjustable impedance unit to a first impedance value to thereby make the voltage controlled oscillator generate the first synthesized signal, and the control unit further sets the adjustable impedance unit to a second impedance value to thereby make the controllable oscillator generate the second synthesized signal.

7. A signal generating method, for generating a synthesized signal according to an input signal, comprising:

(a) utilizing a phase-locked loop device to generate the synthesized signal, wherein the phase-locked loop device comprises:

a phase/frequency detector, for generating a detected signal according to a reference oscillating signal and a feedback signal;

a control signal generator, coupled to the phase/frequency detector, for generating a control signal according to the detected signal;

a voltage controlled oscillator, coupled to the control signal generator, for generating the synthesized signal according to the control signal; and a divider, coupled to the voltage controlled oscillator, for dividing the synthesized signal according to a dividing factor for generating the feedback signal;

(b) controlling the control signal generator to adjust the control signal in a calibration mode to thereby adjust a frequency of the synthesized signal, wherein the phase detector does not output the detected signal to the control signal generator in the calibration mode;

(c) detecting the synthesized signal to generate a calibrating signal in the calibration mode;

(d) filtering the input signal and calibrating the input signal according to the calibrating signal to generate a filtered signal; and (e) modulating the filtered signal to generate the dividing factor.

8. The signal generating method of claim 7, wherein the step (c) comprises:

detecting a first synthesized signal and a second synthesized signal to generate a first counting value and a second counting value respectively;

registering the first counting value and the second counting value; and generating the calibrating signal according to a predetermined difference value and a difference value between the first counting value and the second counting value.

9. The signal generating method of claim 8, wherein the step (a) comprises:

generating a charging current;

selectively coupling the charging current to an output node of the control signal generator;

generating a discharging current;

selectively coupling the discharging current to the output node of the control signal generator;

generating a bias current; and utilizing an impedance unit to set the control signal according to an equivalent current flowing through the impedance unit, wherein when the charging current is coupled to the output node of the control signal generator and the discharging current is not coupled to the output node of the control signal generator, a first control signal is outputted to the controllable oscillator to make the controllable oscillator generate the first synthesized signal, and when the charging current is not coupled to the output node of the control signal generator and the discharging current is coupled to the output node of the control signal generator, a second control signal is outputted to the voltage controlled oscillator to make the voltage controlled oscillator generate the second synthesized signal.

10. The signal generating method of claim 8, wherein the step (a) comprises:

generating a charging current;

selectively coupling the charging current to an output node of the control signal generator;

generating a discharging current;

selectively coupling the discharging current to the output node of the control signal generator;

utilizing an adjustable impedance unit to set the control signal according to the current flowing through the impedance unit, wherein when one of the charging current and the discharging current is coupled to the output node of the control signal generator, the adjustable impedance unit is set to a first impedance value to thereby make the voltage controlled oscillator generate the first synthesized signal, and the adjustable impedance unit is further set to a second impedance value to thereby make the voltage controlled oscillator generate the second synthesized signal.

11. The signal generating method of claim 8, wherein the step (a) comprises:

generating a charging current;
selectively coupling the charging current to an output node of the control signal generator;
generating a discharging current;
selectively coupling the discharging current to the output node of the control signal generator;
utilizing an adjustable bias current source to generate a bias current; and
utilizing an impedance unit to set the control signal according to an equivalent current flowing through the impedance unit, wherein in the calibration mode, the adjustable bias current source provides a first bias current to thereby make the voltage controlled oscillator generate the first synthesized signal, and the adjustable bias current source further provides a second bias current to thereby make the voltage controlled oscillator generate the second synthesized signal.

12. The signal generating method of claim 8, wherein the step (a) comprises:

generating a charging current;
selectively coupling the charging current to an output node of the control signal generator;
generating a discharging current;
selectively coupling the discharging current to the output node of the control signal generator;
generating a bias current; and
utilizing an adjustable impedance unit to set the control signal according to an equivalent current flowing through the impedance unit, wherein in the calibration mode, the adjustable impedance unit is set to a first impedance value to thereby make the voltage controlled oscillator generate the first synthesized signal, and the adjustable impedance unit is further set to a second impedance value to thereby make the voltage controlled oscillator generate the second synthesized signal.

* * * * *